United States Patent
Tamaru et al.

(10) Patent No.: US 12,334,705 B2
(45) Date of Patent: Jun. 17, 2025

(54) LASER APPARATUS AND ELECTRONIC DEVICE MANUFACTURING METHOD

(71) Applicant: Gigaphoton Inc., Tochigi (JP)

(72) Inventors: Yuki Tamaru, Oyama (JP); Taisuke Miura, Oyama (JP)

(73) Assignee: Gigaphoton Inc., Tochigi (JP)

( * ) Notice: Subject to any disclaimer, the term of this patent is extended or adjusted under 35 U.S.C. 154(b) by 433 days.

(21) Appl. No.: 17/818,178

(22) Filed: Aug. 8, 2022

(65) Prior Publication Data

US 2022/0393425 A1 Dec. 8, 2022

Related U.S. Application Data

(63) Continuation of application No. PCT/JP2020/013579, filed on Mar. 26, 2020.

(51) Int. Cl.
*H01S 3/225* (2006.01)
*H01S 3/083* (2006.01)
*H01S 3/23* (2006.01)

(52) U.S. Cl.
CPC .......... *H01S 3/225* (2013.01); *H01S 3/0835* (2013.01); *H01S 3/2308* (2013.01)

(58) Field of Classification Search
CPC ...... H01S 3/225; H01S 3/0835; H01S 3/2308; H01S 3/0804; H01S 3/0064; H01S 3/0071; H01S 3/2333; H01S 2301/02; H01S 3/08059; H01S 3/0816; H01S 3/08004; H01S 3/08009; G03F 7/70025
See application file for complete search history.

(56) References Cited

U.S. PATENT DOCUMENTS

| 8,675,700 B2 | 3/2014 | Watanabe et al. |
| 9,904,068 B1 | 2/2018 | Stinson et al. |
| 2007/0014326 A1* | 1/2007 | Wakabayashi ...... H01S 3/08009 372/101 |
| 2008/0115342 A1* | 5/2008 | Fujimoto ............... H01S 3/225 29/428 |

(Continued)

FOREIGN PATENT DOCUMENTS

| JP | H09-8389 A | 1/1997 |
| JP | 2000-349381 A | 12/2000 |

(Continued)

OTHER PUBLICATIONS

International Search Report issued in PCT/JP2020/013579; mailed Jul. 7, 2020.

(Continued)

*Primary Examiner* — Xinning(Tom) Niu
(74) *Attorney, Agent, or Firm* — Studebaker Brackett PLLC

(57) ABSTRACT

A laser apparatus according to an aspect of the present disclosure includes a master oscillator configured to emit a laser beam, an amplifier including an optical resonator and configured to amplify the laser beam emitted by the master oscillator in the optical resonator, and a phase shift structure disposed on an optical path between the master oscillator and the amplifier at a position closer to the amplifier than a middle point of the optical path. The phase shift structure includes a plurality of cells having different phase shift amounts for the laser beam. The cells have a disposition interval of 80 μm to 275 μm inclusive.

18 Claims, 11 Drawing Sheets

(56) References Cited

U.S. PATENT DOCUMENTS

| | | | |
|---|---|---|---|
| 2010/0150184 A1 | 6/2010 | Kuksenkov | |
| 2012/0250709 A1 | 10/2012 | Watanabe et al. | |
| 2013/0003032 A1* | 1/2013 | Jain | H01S 3/10 355/77 |
| 2017/0149199 A1* | 5/2017 | Tei | H01S 3/10092 |
| 2019/0288472 A1 | 9/2019 | Onose | |

FOREIGN PATENT DOCUMENTS

| | | | | |
|---|---|---|---|---|
| JP | 2011-192849 A | 9/2011 | | |
| JP | 2012-156531 A | 8/2012 | | |
| JP | 2012-204819 A | 10/2012 | | |
| TW | 201037931 A1 | 10/2010 | | |
| WO | WO-2018138819 A1 * | 8/2018 | ......... | G02B 27/0983 |

OTHER PUBLICATIONS

International Preliminary Report On Patentability and Written Opinion issued in PCT/JP2020/013579; issued Sep. 22, 2022.

An Office Action; mailed by the China National Intellectual Property Administration of the People's Republic of China on Sep. 21, 2024, which corresponds to Chinese Patent Application No. 202080095261.X and is related to U.S. Appl. No. 17/818,178.

An Office Action issued by the Japanese Patent Office on Oct. 17, 2023, which corresponds to Japanese Patent Application 2022-510251 and is related to U.S. Appl. No. 17/818,178.

A Notice of Decision of Granting Patent Right mailed by China National Intellectual Property Administration on Jan. 20, 2025, which corresponds to Chinese Patent Application No. 202080095261.X and is related to U.S. Appl. No. 17/818,178.

* cited by examiner

LASER APPARATUS AND ELECTRONIC DEVICE MANUFACTURING METHOD

CROSS-REFERENCE TO RELATED APPLICATIONS

The present application is a continuation application of International Application No. PCT/JP2020/013579, filed on Mar. 26, 2020, the entire contents of which are hereby incorporated by reference.

BACKGROUND

1. Technical Field

The present disclosure relates to a laser apparatus and an electronic device manufacturing method.

2. Related Art

Recently, in a semiconductor exposure apparatus, resolving power improvement has been requested along with miniaturization and high integration of a semiconductor integrated circuit. Thus, the wavelength of light discharged from an exposure light source has been shortened. Examples of a gas laser apparatus for exposure include a KrF excimer laser apparatus configured to emit a laser beam having a wavelength of 248 nm approximately and an ArF excimer laser apparatus configured to emit a laser beam having a wavelength of 193 nm approximately.

The KrF excimer laser apparatus and the ArF excimer laser apparatus have a wide spectrum line width of 350 to 400 pm for spontaneous oscillation light. Thus, chromatic aberration occurs in some cases when a projection lens is made of a material that transmits ultraviolet light such as a KrF laser beam and an ArF laser beam. As a result, resolving power potentially decreases. Thus, the spectrum line width of a laser beam emitted from such a gas laser apparatus needs to be narrowed until chromatic aberration becomes negligible. To narrow the spectrum line width, a line narrowing module (LNM) including a line narrowing element (for example, etalon or grating) is provided in a laser resonator of the gas laser apparatus in some cases. In the following description, a gas laser apparatus that achieves narrowing of the spectrum line width is referred to as a line narrowed gas laser apparatus.

LIST OF DOCUMENTS

Patent Documents

Patent Document 1: U.S. Pat. No. 8,675,700
Patent Document 2: U.S. Pat. No. 9,904,068

SUMMARY

A laser apparatus according to an aspect of the present disclosure includes a master oscillator configured to emit a laser beam, an amplifier including an optical resonator and configured to amplify the laser beam emitted by the master oscillator in the optical resonator, and a phase shift structure disposed on an optical path between the master oscillator and the amplifier at a position closer to the amplifier than a middle point of the optical path. The phase shift structure includes a plurality of cells having different phase shift amounts for the laser beam. The cells have a disposition interval of 80 μm to 275 μm inclusive.

A laser apparatus according to another aspect of the present disclosure includes a master oscillator configured to emit a laser beam, an amplifier including an optical resonator and configured to amplify the laser beam emitted by the master oscillator in the optical resonator, and a phase shift structure disposed on an optical path between the master oscillator and the amplifier at a position closer to the amplifier than a middle point of the optical path. The phase shift structure includes a plurality of cells having different phase shift amounts for the laser beam. The cells have a disposition interval of $\lambda/(1.5 \cdot \theta_{max})$ to $\lambda/\theta_{min}$ inclusive when $\lambda$ represents a wavelength of the laser beam, $\theta_{max}$ represents an upper limit of a beam expansion angle of a laser beam emitted from the amplifier, and $\theta_{min}$ represents a lower limit of the beam expansion angle.

An electronic device manufacturing method according to another aspect of the present disclosure includes generating a laser beam amplified by an amplifier by using a laser apparatus, emitting the amplified laser beam to an exposure apparatus, and exposing a photosensitive substrate to the laser beam in the exposure apparatus to manufacture an electronic device. The laser apparatus includes a master oscillator configured to emit a laser beam, the amplifier including an optical resonator and configured to amplify the laser beam emitted by the master oscillator in the optical resonator, and a phase shift structure disposed on an optical path between the master oscillator and the amplifier at a position closer to the amplifier than a middle point of the optical path. The phase shift structure includes a plurality of cells having different phase shift amounts for the laser beam. The cells have a disposition interval of 80 μm to 275 μm inclusive.

BRIEF DESCRIPTION OF THE DRAWINGS

Embodiments of the present disclosure will be described below merely as examples with reference to the accompanying drawings.

DESCRIPTION OF EMBODIMENTS

<Contents>
1. Terms
   1.1 Random phase plate
   1.2 Dimension and aspect ratio of cell
2. Overview of laser apparatus according to comparative example
   2.1 Configuration
   2.2 Operation
   2.3 Problem
3. Embodiment 1
   3.1 Configuration
   3.2 Pitch of random phase plate
   3.3 Specific numerical example 1
   3.4 Specific numerical example 2
   3.5 Pitch condition generalization
   3.6 Operation
   3.7 Effect
4. Embodiment 2
   4.1 Configuration
   4.2 Operation
   4.3 Effect
5. Embodiment 3
   5.1 Configuration
   5.2 Operation
   5.3 Effect
6. Embodiment 4
   6.1 Configuration
   6.2 Operation
   6.3 Effect
   6.4 Modification
7. Electronic device manufacturing method
8. Other Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Terms 1.1 Random Phase Plate

Figure 1:
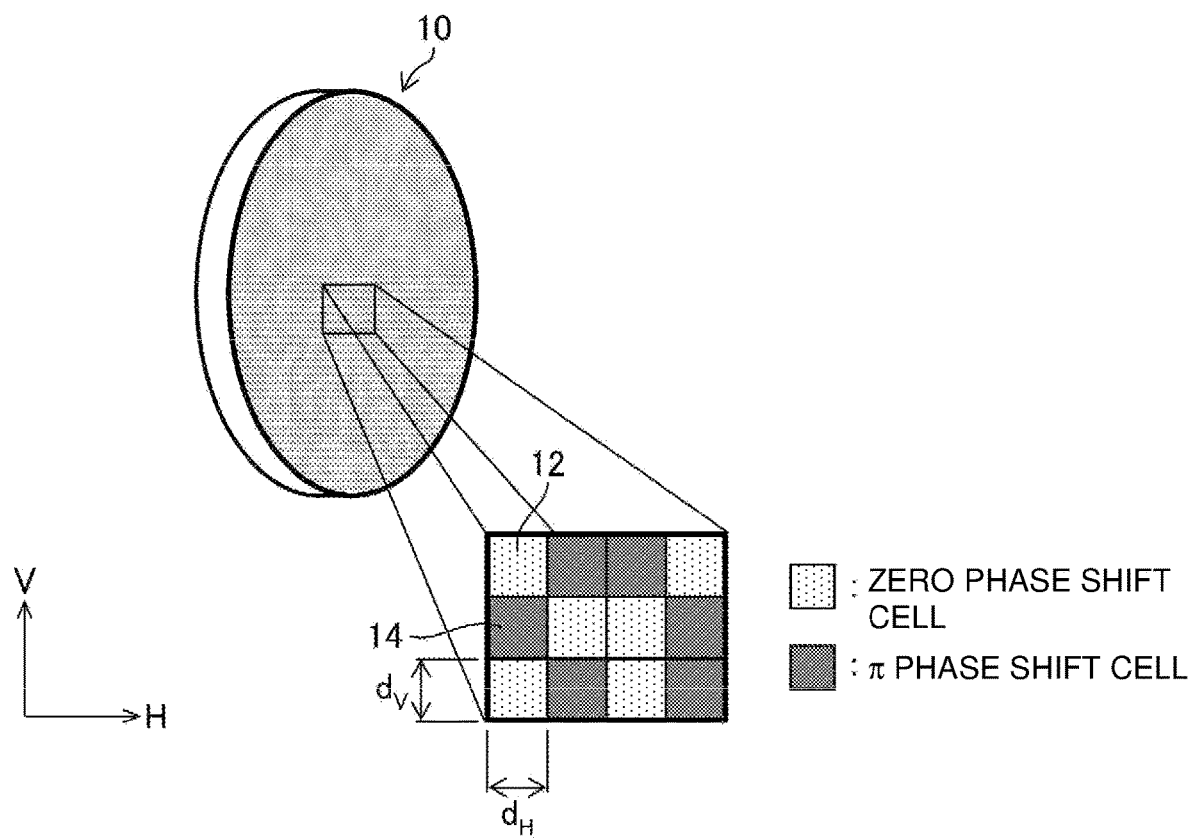
FIG. 1 schematically illustrates the configuration of an exemplary random phase plate.

FIG. 1 schematically illustrates the configuration of an exemplary random phase plate 10. The random phase plate 10 includes two kinds of phase shift cells, namely, a cell 12 having a transmission phase shift amount of zero and a cell 14 having a transmission phase shift amount of π. The cell 12 having a shift amount of zero and the cell 14 having a shift amount of π have, for example, an area ratio of 1:1. The area ratio may be other than 1:1. A phase shift cell is simply referred to as a "cell" in some cases. The cell 12 is an example of a "first cell" in the present disclosure, and the cell 14 is an example of a "second cell" in the present disclosure.

Equiphase cells as cells having the same shape are formed in a polygonal shape. The shape of a speckle pattern changes with the shape of cells. The dimension or disposition interval of cells is referred to as a "pitch". The "dimension" may be interpreted as a "length" or "size".

FIG. 1 illustrates an example in which each cell has a square shape and the disposition interval is equal to the dimension of the cell. In the case of FIG. 1, a V direction length $d_V$ and an H direction length $d_H$ of each cell are equal and, for example, 80 μm. In this case, the pitch in each of the V direction and the H direction is 80 μm. The shape of each cell of the random phase plate 10 illustrated in FIG. 1 is a regular polygon, but the shape of each cell is not limited to a regular polygon.

Figure 2:
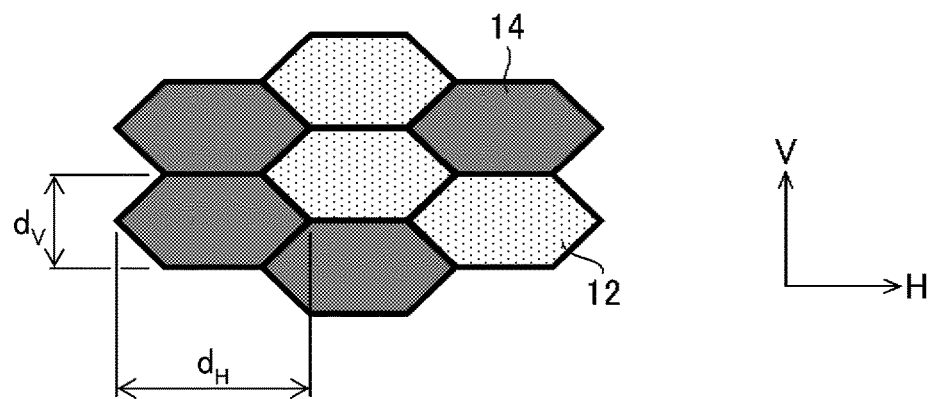
FIG. 2 illustrates exemplary arrangement of cells when each cell has a hexagonal shape.

FIG. 2 illustrates exemplary arrangement of cells when each cell has a hexagonal shape. In FIG. 2, the longitudinal direction is defined as the V direction, and the lateral direction orthogonal to the V direction is defined as the H direction. A beam expansion angle in each direction can be adjusted by changing the ratio of the V direction length $d_V$ and the H direction length $d_H$ of each cell (aspect ratio of the cell) as illustrated in FIG. 2.

1.2 Dimension and Aspect Ratio of Cell

Each cell of the random phase plate 10 is a minimum unit region having a predetermined shape and serving as a convex part region or a concave part region in a concave-convex pattern that provides a phase difference to light. A plurality of cells having a predetermined shape are periodically arrayed on an element surface of the random phase plate 10. The term "periodically" means regular arrangement in a particular spatially repetitive pattern. In other words, the element surface of the random phase plate 10 is divided in a plurality of cells, and each cell is formed as a concave or convex part region. A concave or convex part region is disposed spatially at random for each cell on the element surface of the random phase plate 10. A phase shift structure in which a plurality of cells having different phase shift amounts are disposed spatially at random is referred to as a "random phase structure". The random phase plate 10 is an example of an optical element having a random phase structure.

The "aspect ratio" of the shape of each cell is defined as follows. Specifically, the aspect ratio is defined to be d2/d1 when a first direction and a second direction orthogonal to the first direction are defined as in-surface directions parallel to the element surface of the random phase plate 10, d1 represents the length of the cell in the first direction, and d2 represents the length of the cell in the second direction.

Figure 3:
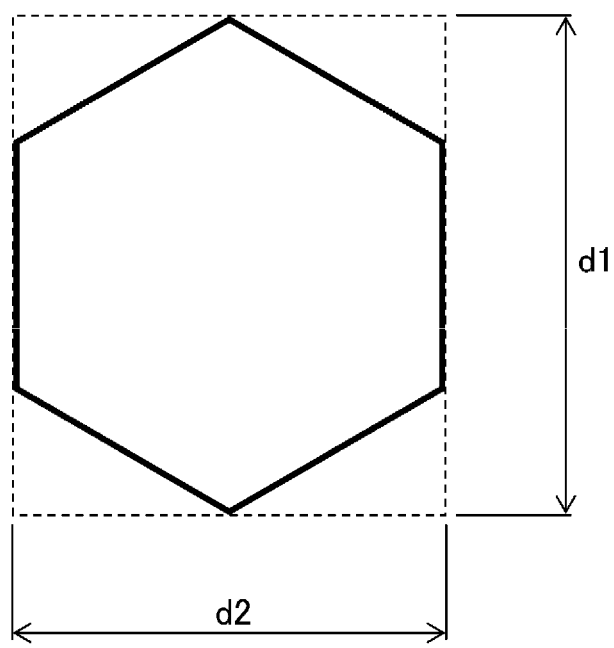
FIG. 3 illustrates an exemplary hexagonal cell.

FIG. 3 illustrates an exemplary hexagonal cell. In FIG. 3, the longitudinal direction is defined as the first direction, and the lateral direction is defined as the second direction. The first direction length d1 of the cell is the line interval of a first line tangent to the outline of the cell and parallel to the second direction. The second direction length d2 of the cell is the line interval of a second line tangent to the outline of the cell and parallel to the first direction. The first direction length d1 can be the disposition interval of cells in the first direction. The second direction length d2 can be the disposition interval of cells in the second direction.

In a case of a laser apparatus including an oscillation stage laser (master oscillator) and an excimer amplifier (power oscillator), the excimer amplifier including an optical resonator, the first direction is specified in relation to a discharge direction (the V direction) of the excimer amplifier. The first direction is a direction corresponding to the V direction, and the second direction is a direction corresponding to the H direction. "Corresponding directions" are relatively same directions in beam sections at different positions on an optical path. In a case in which a mirror or the like that changes the traveling direction of a laser beam exists on the optical path between the random phase plate 10 and the excimer amplifier, the first direction of the random phase plate 10 and the discharge direction of the excimer amplifier are different from each other in some cases. However, it is understood that the first direction in a beam section of a laser beam having passed through the random phase plate 10 and the V direction in a beam section of a laser beam entering the excimer amplifier are relatively same directions.

The first direction may be parallel to the V direction in a case in which neither a mirror nor the like that changes the traveling direction of a laser beam exists on the optical path between the random phase plate 10 and the excimer amplifier and the first direction in a beam section of a laser beam having passed through the random phase plate 10 is maintained when the laser beam enters the excimer amplifier.

The term "parallel" in the present specification may include the concept of being substantially parallel, which can be regarded as being parallel in effect in technological meanings. The term "perpendicular" or "orthogonal" in the present specification may include the concept of being substantially perpendicular or substantially orthogonal, which can be regarded as being perpendicular in effect or orthogonal in effect in technological meanings.

2. Overview of Laser Apparatus According to Comparative Example

2.1 Configuration

Figure 4:
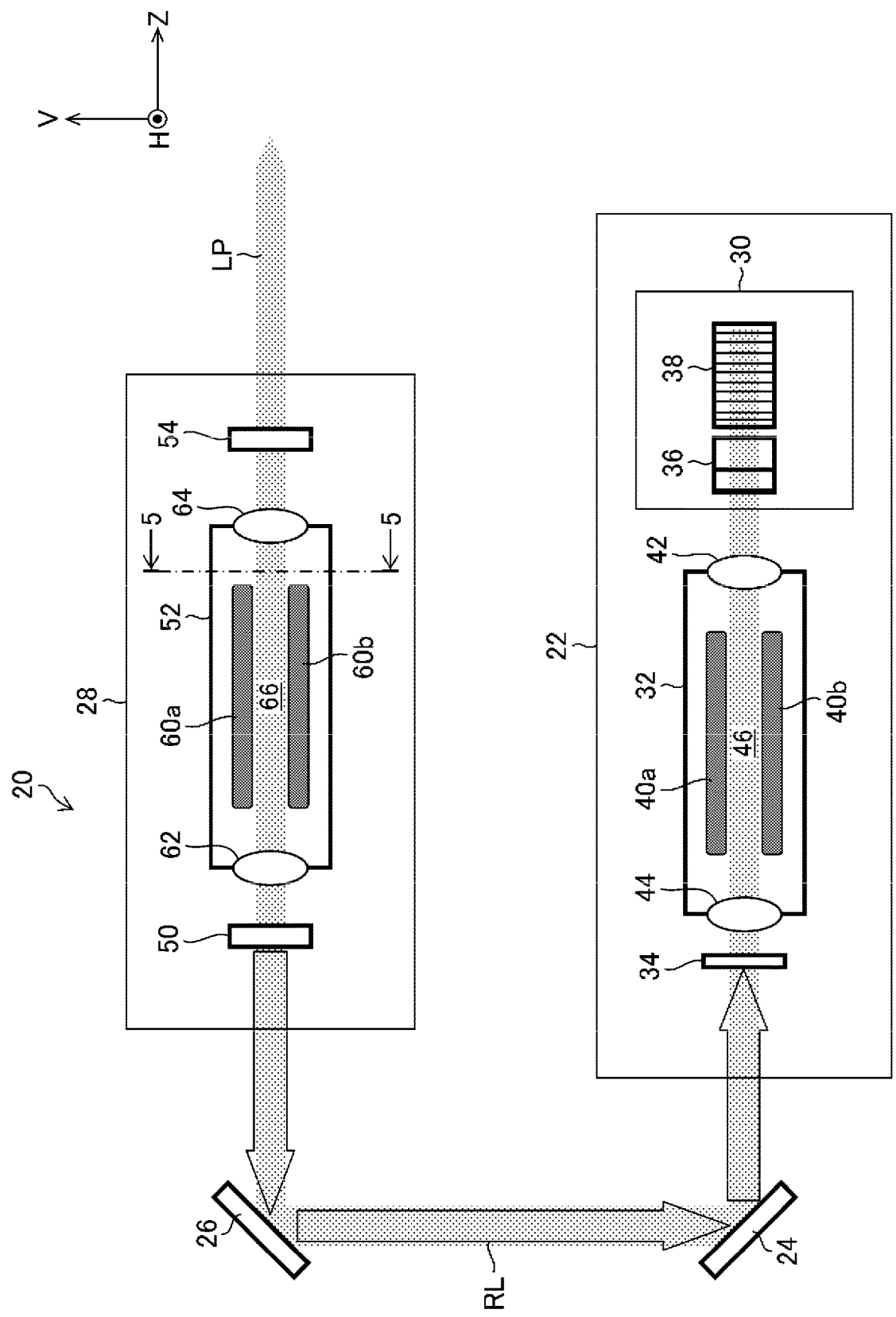
FIG. 4 is a side view schematically illustrating an exemplary configuration of a laser apparatus according to a comparative example.

FIG. 4 is a side view schematically illustrating an exemplary configuration of a laser apparatus 20 according to a comparative example. The comparative example of the present disclosure is an example that the applicant recognizes as known only by the applicant, but is not a publicly known example that is recognized by the applicant.

The laser apparatus 20 includes a master oscillator 22, high reflectance mirrors 24 and 26, and a power oscillator 28. The master oscillator 22 is a discharge-pumped excimer laser apparatus including a line narrowing module (LNM) 30, a chamber 32, and an output coupling mirror 34.

The LNM 30 includes a prism 36 for narrowing a spectrum width and a grating 38. The grating 38 is disposed in Littrow arrangement such that an incident angle is equal to a diffracting angle. The output coupling mirror 34 is a partially reflective mirror having a reflectance of 20% to 30%. The output coupling mirror 34 is disposed to constitute an optical resonator together with the LNM 30.

The chamber 32 is disposed on the optical path of the optical resonator. The chamber 32 includes a pair of discharge electrodes 40a and 40b and two windows 42 and 44 through which a laser beam passes. Laser gas is introduced into the chamber 32. The laser gas is excimer laser gas containing rare gas, halogen gas, and buffer gas. The rare gas may be, for example, argon (Ar) or krypton (Kr) gas. The halogen gas may be, for example, fluorine ($F_2$) gas. The buffer gas may be, for example, neon (Ne) gas. Voltage is applied between the discharge electrodes 40a and 40b by a non-illustrated power source. The power source may be a pulse power module (PPM) including a switch and a charging capacitor.

The high reflectance mirrors 24 and 26 are disposed on the optical path between the master oscillator 22 and the power oscillator 28 such that a laser beam emitted from the master oscillator 22 enters the power oscillator 28.

The power oscillator 28 is an excimer amplifier including a rear mirror 50, a chamber 52, and an output coupling mirror 54. The rear mirror 50 and the output coupling mirror 54 constitute an optical resonator, and the chamber 52 is disposed on the optical path of the optical resonator. The configuration of the chamber 52 may be the same as that of the chamber 32 of the master oscillator 22. The chamber 52 includes a pair of discharge electrodes 60a and 60b and two windows 62 and 64. The laser gas is introduced into the chamber 52. The rear mirror 50 is a partially reflective mirror having a reflectance of 80% to 90%. The output coupling mirror 54 is a partially reflective mirror having a reflectance of 20% to 30%.

In FIG. 4, the optical path axis direction of a laser beam emitted from the power oscillator 28 is defined as a Z direction. Two directions substantially orthogonal to the Z direction may be the H direction and the V direction. The H direction is a direction substantially orthogonal to the sheet of FIG. 1.

Figure 5:
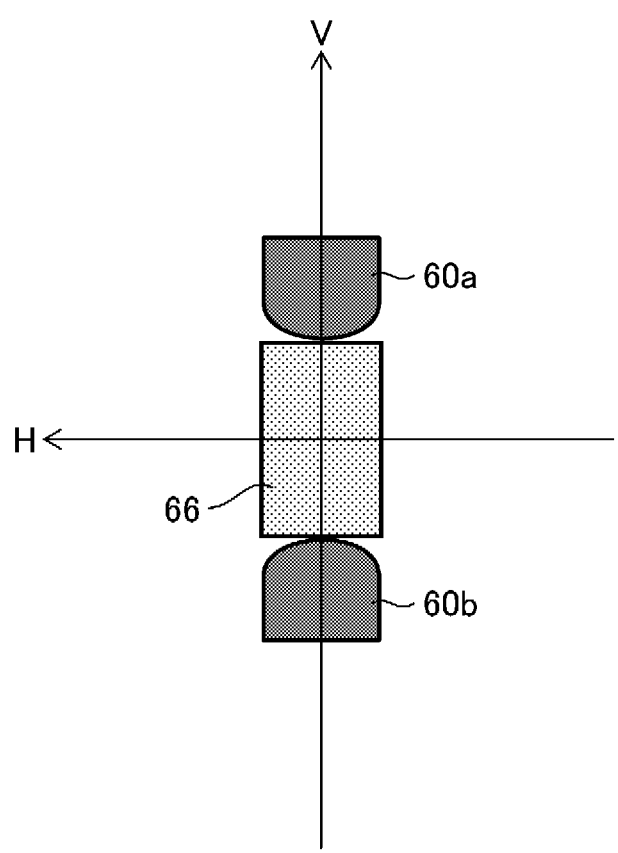
FIG. 5 is a cross-sectional view of a chamber illustrated in FIG. 4, which is taken along line 5-5.

FIG. 5 is a cross-sectional view of the chamber 52 illustrated in FIG. 4, which is taken along line 5-5. As illustrated in FIG. 5, the discharge electrodes 60a and 60b are disposed opposite each other across a discharge space 66 in the V direction. The discharge space 66 is a space between the discharge electrodes 60a and 60b. A "discharge space" is also called a "discharge region". The V direction corresponds to the discharge direction. Note that, similarly, a discharge space 46 in the chamber 32 of the master oscillator 22 illustrated in FIG. 4 is a space between the discharge electrodes 40a and 40b.

2.2 Operation

When discharge occurs with voltage applied between the discharge electrodes 40a and 40b in the chamber 32 of the master oscillator 22, the laser gas is excited and a pulse laser beam having a spectral width that is narrowed via the optical resonator constituted by the output coupling mirror 34 and the LNM 30 is output from the output coupling mirror 34.

The pulse laser beam is transmitted via the high reflectance mirrors 24 and 26 and incident as a seed beam on the rear mirror 50 of the power oscillator 28. The seed beam having passed through the rear mirror 50 enters the chamber 52. When the seed beam enters the chamber 52, discharge is caused between the discharge electrodes 60a and 60b. As a result, the laser gas in the chamber 52 is excited, the seed beam is amplified by the optical resonator constituted by the output coupling mirror 54 and the rear mirror 50, and the amplified laser beam is output as an output laser beam LP from the output coupling mirror 54.

2.3 Problem

Since the rear mirror 50 of the power oscillator 28 is a partially reflective mirror having a reflectance of 80% to 90%, part of a laser beam emitted by the master oscillator 22 is reflected by the rear mirror 50 and returned to the master oscillator 22 side. The laser beam returned to the master oscillator 22 side is referred to as "return light". This return light RL adversely affects stability of emission energy and wavelength in some cases.

Specifically, the return light RL is returned to the master oscillator 22, taken into the optical resonator again, and increases a thermal load on the master oscillator 22 as a result, which destabilizes performance of the master oscillator 22.

3. Embodiment 1

3.1 Configuration

Figure 6:
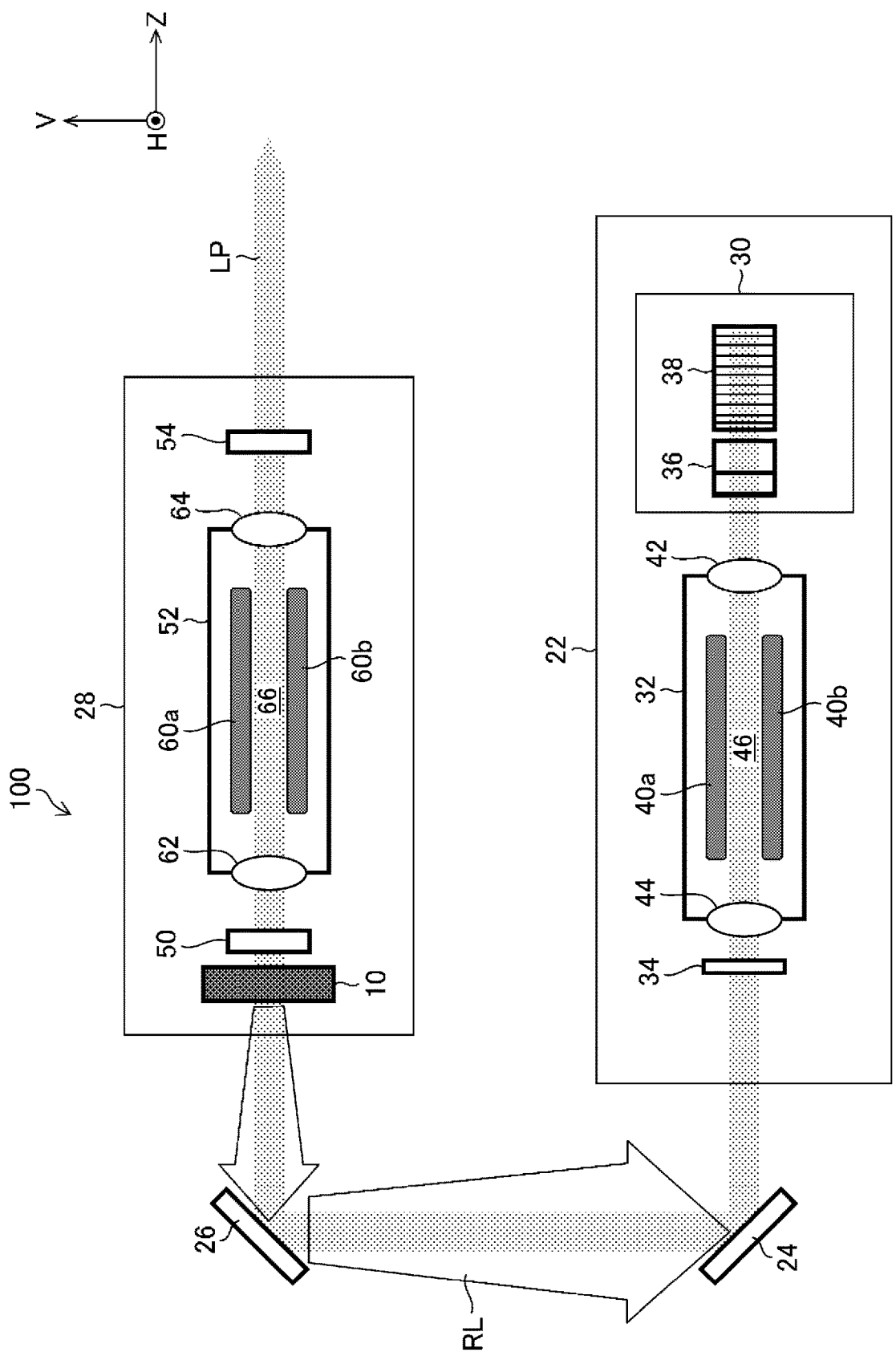
FIG. 6 schematically illustrates an exemplary configuration of a laser apparatus according to Embodiment 1.

FIG. 6 schematically illustrates an exemplary configuration of a laser apparatus 100 according to Embodiment 1.

Description will be made on the difference of the configuration illustrated in FIG. 6 from the configuration illustrated in FIG. 4.

The laser apparatus 100 includes the random phase plate 10 on the optical path between the rear mirror 50 and the high reflectance mirror 26. The random phase plate 10 may be disposed in a housing of the power oscillator 28. The distance between the random phase plate 10 and the rear mirror 50 is preferably as short as possible. When the distance between the random phase plate 10 and the rear mirror 50 is shortened, decrease of the efficiency of seed beam injection into the optical resonator of the power oscillator 28 can be suppressed and the distance between the random phase plate 10 and the output coupling mirror 34 of the master oscillator 22 relatively increases. Accordingly, due to beam expansion of the return light RL by the random phase plate 10 as well, the amount of light reentering the master oscillator 22 can be reduced. The random phase plate 10 is an example of a "phase shift structure" in the present disclosure. The power oscillator 28 is an example of an "amplifier" in the present disclosure. The high reflectance mirrors 24 and 26 are an example of "a plurality of mirrors" in the present disclosure. The high reflectance mirror 26 is an example of a "mirror closest to the optical resonator among the mirrors" in the present disclosure.

In the laser apparatus 100, a non-illustrated aperture may be disposed near the output coupling mirror 34 of the master oscillator 22 to shield the return light RL expanded through the random phase plate 10. The aperture may have a size substantially equal to that of the beam shape of a laser beam emitted from the master oscillator 22.

Figure 7:
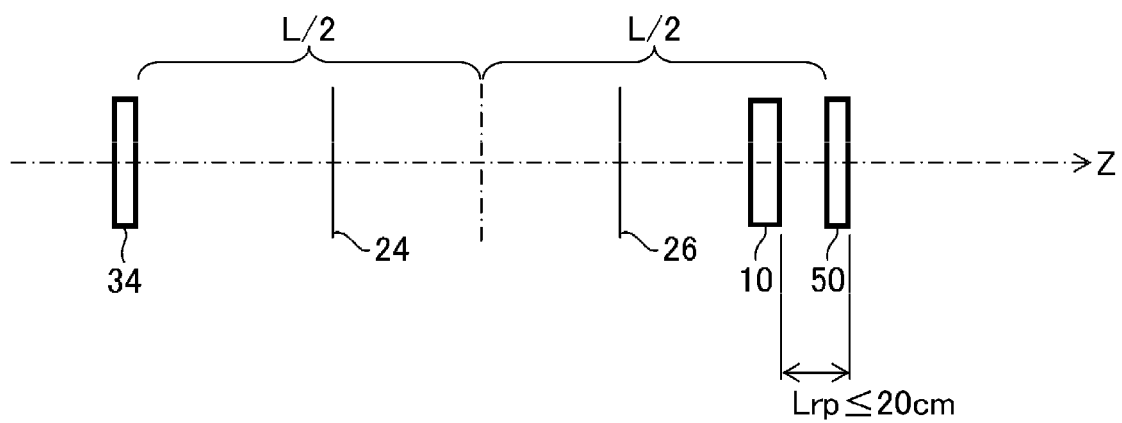
FIG. 7 is an explanatory diagram schematically illustrating an exemplary disposition place of the random phase plate.

FIG. 7 is an explanatory diagram schematically illustrating an exemplary disposition place of the random phase plate 10. The random phase plate 10 is disposed on the optical path between the output coupling mirror 34 and the rear mirror 50 at a position closer to the rear mirror 50 than (on the rear mirror 50 side of) the middle point of the optical path. In FIG. 7, the Z axis represents the axis of the optical path between the output coupling mirror 34 and the rear mirror 50, and L represents the distance between the output coupling mirror 34 and the rear mirror 50. The position closer to "the rear mirror 50 than the middle point" of the optical path is an example of a position "closer to the amplifier than a middle point" of the optical path in the present disclosure. A distance Lrp between the random phase plate 10 and the rear mirror 50 is preferably equal to or shorter than 20 cm. The effect of return light suppression decreases as the random phase plate 10 approaches the output coupling mirror 34 of the master oscillator 22. Thus, the random phase plate 10 is preferably disposed as close as possible to the rear mirror 50. Alternatively, the rear mirror 50 and the random phase plate 10 may be integrated. The same optical element may be coated with a partial reflection film and a random phase structure film like Embodiment 2 to be described later, in which a back surface of the rear mirror 50 on a partial reflection film side is coated with a random phase structure film.

When the random phase plate 10 is disposed at a close distance of 20 cm or shorter from the rear mirror 50, the distance between the random phase plate 10 and the output coupling mirror 34 of the master oscillator 22 is relatively long and thus the effect of suppressing return light to the master oscillator 22 can be sufficiently obtained.

3.2 Pitch of Random Phase Plate

As for the pitch of the random phase plate 10, a preferable pitch condition is specified based on the beam expansion angles of a laser beam emitted from the power oscillator 28 from a viewpoint as follows. The beam expansion angles of the output laser beam LP coming out of the power oscillator 28 with no random phase plate 10 provided on the optical path between the master oscillator 22 and the power oscillator 28 are defined as $\theta_{AH}$ and $\theta_{AV}$. The angle $\theta_{AH}$ is the beam expansion angle in the H direction, and the angle $\theta_{AV}$ is the beam expansion angle in the V direction. The beam expansion angles in the H and V directions after transmission through the random phase plate 10 are defined as $\theta_{RPP\_H}$ and $\theta_{RPP\_V}$. The angles $\theta_{RPP\_H}$ and $\theta_{RPP\_V}$ are approximated by expressions below.

[Expression 1]
$$\theta_{RPP\_H} \approx \frac{\lambda}{d_H} \tag{1}$$

[Expression 2]
$$\theta_{RPP\_V} \approx \frac{\lambda}{d_V} \tag{2}$$

In the expressions, $\lambda$ represents the wavelength, $d_H$ represents the H direction length of each cell, and $d_V$ represents the V direction length of each cell.

The pitch of the random phase plate 10 is selected such that the beam expansion angles are substantially equal to $\theta_{AH}$ and $\theta_{AV}$, respectively, in other words, Expressions (3) and (4) below are satisfied.

[Expression 3]
$$\theta_{AH} \approx \theta_{RPP\_H} \tag{3}$$

[Expression 4]
$$\theta_{AV} \approx \theta_{RPP\_V} \tag{4}$$

The description "substantially equal" implies approximation with a difference in a predetermined allowable range. Specifically, the H direction length $d_H$ of each cell is selected such that $\theta_{RPP\_H}$ is approximate to $\theta_{AH}$ with a difference from $\theta_{AH}$ in a predetermined allowable range, and the V direction length $d_V$ of each cell is selected such that $\theta_{RPP\_V}$ is approximate to $\theta_{AV}$ with a difference from $\theta_{AV}$ in a predetermined allowable range.

The predetermined allowable ranges may be set as appropriate within a range in which a technological effect is obtained. The allowable ranges may have the same allowable amount in the V and H directions or may be different between the directions. For example, such an allowable range may be set that the difference between $\theta_{RPP\_H}$ and $\theta_{AH}$ is equal to or smaller than 10% of $\theta_{AH}$, the difference between $\theta_{RPP\_H}$ and $\theta_{AH}$ is equal to or smaller than 0.1 milliradian [mrad], or $\theta_{RPP\_H}$ is not more than 1.5 times larger than $\theta_{AH}$. Description that a pitch is "selected" means that the random phase plate 10 of such a pitch is used for the laser apparatus 100, and includes the concept of being "determined", "specified", and "designed" as the pitch of the random phase plate 10 applied to the laser apparatus 100.

When conditions of Expressions (3) and (4) are satisfied, the beam expansion angles after transmission through the random phase plate 10 are substantially equal to the expansion angles of a laser beam emitted from the master oscillator 22, and accordingly, decrease of the efficiency of light injection into the power oscillator 28 can be suppressed.

3.3 Specific Numerical Example 1

Assume that the laser apparatus 100 is an ArF excimer laser apparatus having a wavelength $\lambda$ of 193 nm, a Gaussian distribution beam profile in the H direction, and a top-hat beam profile in the V direction.

Typical values of the beam expansion angles $\theta_{AH}$ and $\theta_{AV}$ of a laser beam emitted from the ArF excimer laser apparatus in the H and V directions substantially satisfy ranges below.

$$H \text{ direction: } 0.8 \text{ mrad} \leq \theta_{AH} \leq 2.4 \text{ mrad} \quad (5)$$

$$V \text{ direction: } 0.7 \text{ mrad} \leq \theta_{AV} \leq 1.6 \text{ mrad} \quad (6)$$

The beam expansion angle $\theta_{RPP}$ of a laser beam having passed through the random phase plate 10 and a cell pitch d have a relation represented by an expression below.

$$\theta_{RPP} = \lambda/d \quad (7)$$

A condition on the pitch $d_H$ that satisfies Expressions (3) and (5) is calculated, by using the relation of Expression (7), to be a range represented by Expression (8) below.

$$80 \text{ }\mu\text{m} \leq d_H \leq 241 \text{ }\mu\text{m} \quad (8)$$

Similarly, a condition on the pitch $d_V$ that satisfies Expressions (4) and (6) is calculated, by using the relation of Expression (7), to be a range represented by Expression (9) below.

$$120 \text{ }\mu\text{m} \leq d_V \leq 275 \text{ }\mu\text{m} \quad (9)$$

When the H and V directions are comprehensively handled based on Expressions (8) and (9), the pitch d of the random phase plate 10 has a preferable range represented by Expression (10) below.

$$80 \text{ }\mu\text{m} \leq d \leq 275 \text{ }\mu\text{m} \quad (10)$$

The angles $\theta_{AH}$ in Expression (5) and $\theta_{AV}$ in Expression (6) are each an example of "$\theta_A$", in other words, a "beam expansion angle of a laser beam emitted from the amplifier" in the present disclosure. The angles "2.4 mrad" in Expression (5) and "1.6 mrad" in Expression (6) are each an example of "$\theta_{max}$", in other words, the "upper limit of the beam expansion angle of the laser beam emitted from the amplifier" in the present disclosure. The angles "0.8 mrad" in Expression (5) and "0.7 mrad" in Expression (6) are each an example of "$\theta_{min}$", in other words, the "lower limit of the beam expansion angle of the laser beam emitted from the amplifier" in the present disclosure. The angle "2.4 mrad" in Expression (5) is an example of "$\theta_{AH1}$", in other words, the "upper limit of the beam expansion angle of the laser beam emitted from the amplifier in the H direction" in the present disclosure. The angle "1.6 mrad" in Expression (6) is an example of "$\theta_{AV1}$", in other words, the "upper limit of the beam expansion angle of the laser beam emitted from the amplifier in the V direction" in the present disclosure. The angle "0.8 mrad" in Expression (5) is an example of "$\theta_{AH2}$", in other words, the "lower limit of the beam expansion angle of the laser beam emitted from the amplifier in the H direction" in the present disclosure. The angle "0.7 mrad" in Expression (6) is an example of "$\theta_{AV2}$", in other words, the "lower limit of the beam expansion angle of the laser beam emitted from the amplifier in the V direction" in the present disclosure.

3.4 Specific Numerical Example 2

When it is assumed that the numerical ranges of the beam expansion angle conditions represented by Expressions (5) and (6) are expanded to have upper limit values of 1.5 times larger, conditions represented by Expressions (11) and (12) below are obtained.

$$H \text{ direction: } 0.8 \text{ mrad} \leq \theta_{AH} \leq 3.6 \text{ mrad} \quad (11)$$

$$V \text{ direction: } 0.7 \text{ mrad} \leq \theta_{AV} \leq 2.4 \text{ mrad} \quad (12)$$

When the conditions of Expressions (11) and (12) are applied in place of those of Expressions (5) and (6), a condition on the pitch $d_H$ that satisfies Expressions (3) and (11) is calculated, by using the relation of Expression (7), to be a range represented by Expression (13) below.

$$53 \text{ }\mu\text{m} \leq d_H \leq 241 \text{ }\mu\text{m} \quad (13)$$

Similarly, a condition on the pitch $d_V$ that satisfies Expressions (4) and (12) is calculated, by using the relation of Expression (7), to be a range represented by Expression (14) below.

$$80 \text{ }\mu\text{m} \leq d_V \leq 275 \text{ }\mu\text{m} \quad (14)$$

When the H and V directions are comprehensively handled based on Expressions (13) and (14), the pitch d has a preferable range represented by Expression (15) below.

$$53 \text{ }\mu\text{m} \leq d \leq 275 \text{ }\mu\text{m} \quad (15)$$

3.5 Pitch Condition Generalization

As understood from the above discussion of specific numerical example 1, when $\theta_{Amax}$ and $\theta_{Amin}$ represent the upper and lower limit values of the beam expansion angle $\theta_A$ of a Laser Beam Emitted from the Power Oscillator 28 of the laser apparatus 100, the pitch d has a preferable range expressed by, for example, Expression (16) below.

$$\lambda/\theta_{Amax} \leq d \leq \lambda/\theta_{Amin} \quad (16)$$

In addition, as understood from the above discussion of specific numerical example 2, when the beam expansion angle $\theta_{RPP}$ of a laser beam having passed through the random phase plate 10 is allowed to be 1.5 times larger than $\theta_{Amax}$, the pitch d has a preferable range expressed by, for example, Expression (17) below.

$$\lambda/(1.5 \cdot \theta_{Amax}) \leq d \leq \lambda/\theta_{Amin} \quad (17)$$

As clearly understood from Expressions (16) and (17), the minimum value of the selectable range of the pitch d is specified based on the upper limit value $\theta_{Amax}$ of the beam expansion angle $\theta_A$ of a laser beam emitted from the power oscillator 28. The minimum value (lower limit value) of the selectable range of the pitch d changes depending on a degree to which the difference between $\theta_{RPP}$ and $\theta_{Amax}$ is allowed. When $\theta_{RPP}$ is allowed to be k times larger than $\theta_{Amax}$, the pitch d has a preferable range expressed by Expression (18) below.

$$\lambda/(k \cdot \theta_{Amax}) \leq d \leq \lambda/\theta_{Amin} \quad (18)$$

In the expression, k is a value equal to or larger than one and may be, for example, a value that satisfies $1 \leq k \leq 1.5$.

The random phase plate 10 having the pitch d that is suitable for a condition is used for the laser apparatus 100 based on the concept described by using Expressions (16) to (18).

3.6 Operation

The seed beam emitted from the master oscillator 22 passes through the random phase plate 10 and enters the optical resonator of the power oscillator 28. The seed beam reflected by the rear mirror 50 and part of the laser beam amplified by the optical resonator of the power oscillator 28 are output as the return light RL from the rear mirror 50. The random phase plate 10 functions to expand the beam expansion angles of the return light RL output from the rear mirror 50 toward the master oscillator 22. The power oscillator 28 is an example of the "amplifier" in the present disclosure.

3.7 Effect

In the laser apparatus 100 according to Embodiment 1, the pitch of the random phase plate 10 is selected such that the beam expansion angle $\theta_{RPP}$ of a laser beam having passed through the random phase plate 10 is as close as possible to $\theta_A$, and thus decrease of the efficiency of light injection into the optical resonator of the power oscillator 28 is suppressed. Moreover, the amount of light returned to the master oscillator 22 decreases since the return light RL diffuses while passing through the random phase plate 10. Accordingly, stability degradation of energy and wavelength due to the return light RL can be suppressed. Furthermore, decrease of the efficiency of light injection into the optical resonator of the power oscillator 28 can be efficiently suppressed since each cell has a cell shape with an aspect ratio in which the V direction length $d_V$ and the H direction length $d_H$ are different from each other as described with reference to FIG. 2.

4. Embodiment 2

4.1 Configuration

Figure 8:
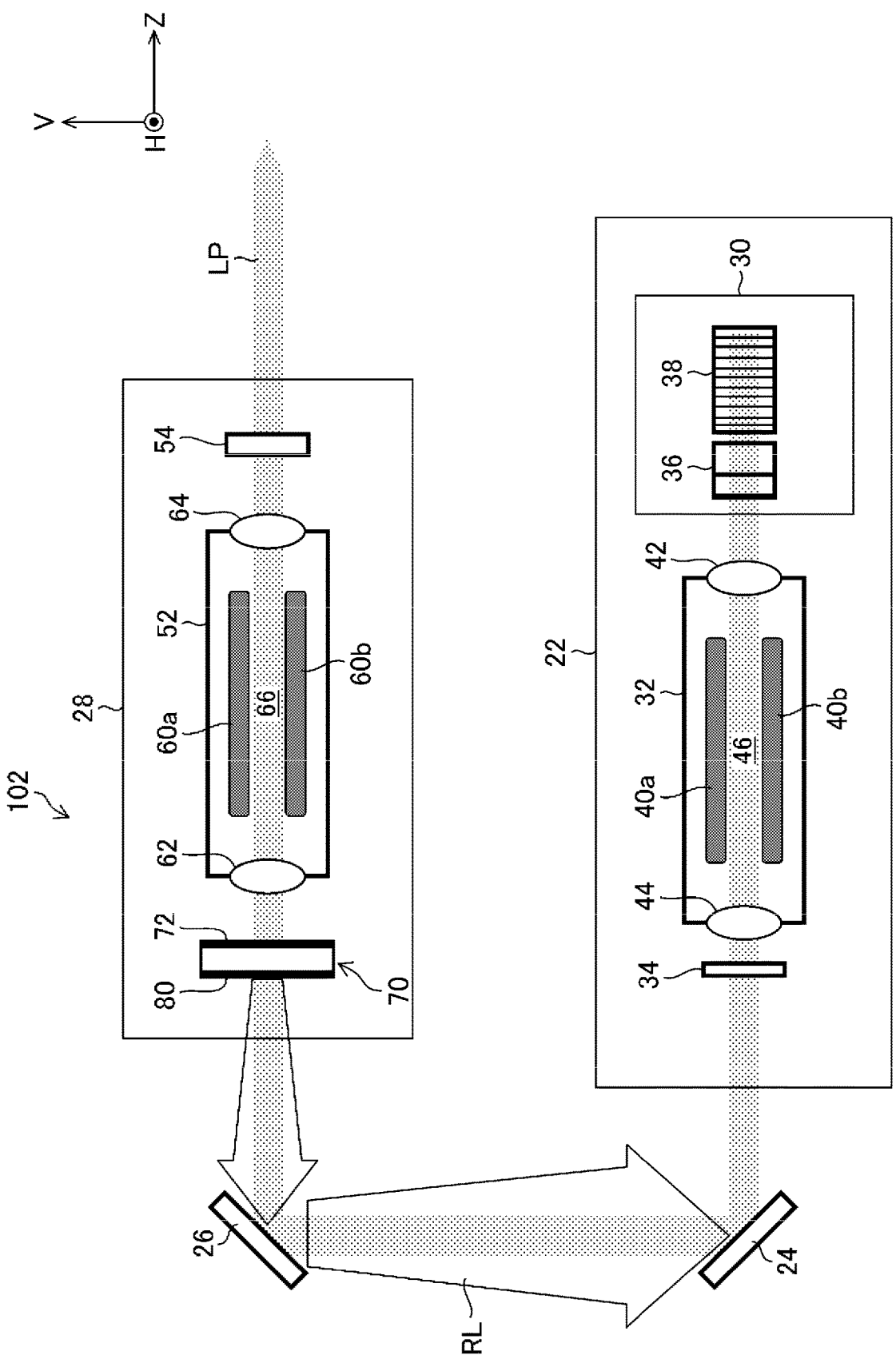
FIG. 8 schematically illustrates an exemplary configuration of a laser apparatus according to Embodiment 2.

FIG. 8 schematically illustrates an exemplary configuration of a laser apparatus 102 according to Embodiment 2. Description will be made on the difference of the configuration illustrated in FIG. 8 from the configuration illustrated in FIG. 6. In the laser apparatus 102 illustrated in FIG. 8, the combination of the random phase plate 10 and the rear mirror 50 is replaced with one optical element 70 having functions of the random phase plate 10 and the rear mirror 50.

Figure 9:
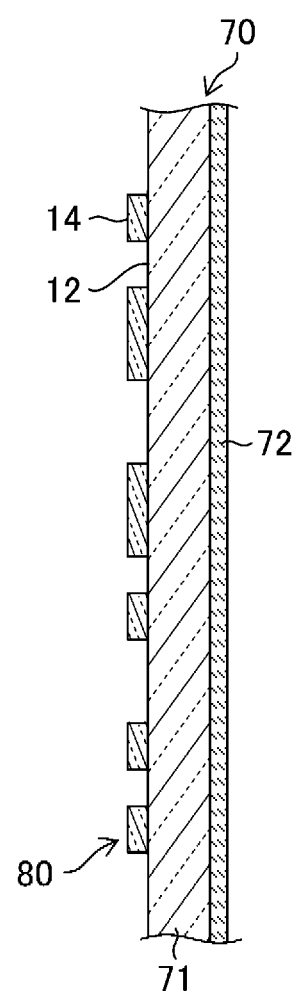
FIG. 9 is an enlarged cross-sectional view schematically illustrating an exemplary configuration of an optical element including a partial reflection film and a random phase structure film.

FIG. 9 is an enlarged cross-sectional view schematically illustrating an exemplary configuration of the optical element 70 including a partial reflection film and a random phase structure film. The optical element 70 is a rear mirror with a random phase structure in which a first surface of a substrate 71 is coated with a partial reflection film 72 and a second surface of the substrate 71 on a side opposite to the first surface is coated with a random phase structure film 80. The substrate 71 is made of a material that transmits light of the ultraviolet wavelength. The material of the substrate 71 may be, for example, synthetic quartz or $CaF_2$.

The partial reflection film 72 and the output coupling mirror 54 constitute an optical resonator. The random phase structure film 80 has a structure same as the cell structure of the random phase plate 10.

4.2 Operation

The seed beam emitted from the master oscillator 22 passes through the optical element 70 and enters the optical resonator of the power oscillator 28. Part of the laser beam amplified by the optical resonator of the power oscillator 28 is output as the return light RL from the optical element 70. The random phase structure film 80 functions to expand the beam expansion angles of the return light RL output from the optical element 70 toward the master oscillator 22.

4.3 Effect

In the laser apparatus 102 according to Embodiment 2, similarly to the laser apparatus 100 according to Embodiment 1, decrease of the efficiency of light injection into the optical resonator of the power oscillator 28 is suppressed. Moreover, the amount of light returned to the master oscillator 22 decreases since the return light RL diffuses while passing through the random phase structure film 80. Accordingly, stability degradation of energy and wavelength due to the return light RL can be suppressed.

According to Embodiment 2, decrease of the light injection efficiency is further suppressed as compared to Embodiment 1 since the partial reflection film 72 and the random phase structure film 80 are provided on the same optical element 70. In addition, according to Embodiment 2, stability degradation of energy and wavelength due to the return light RL can be further suppressed as compared to Embodiment 1.

5. Embodiment 3

5.1 Configuration

Figure 10:
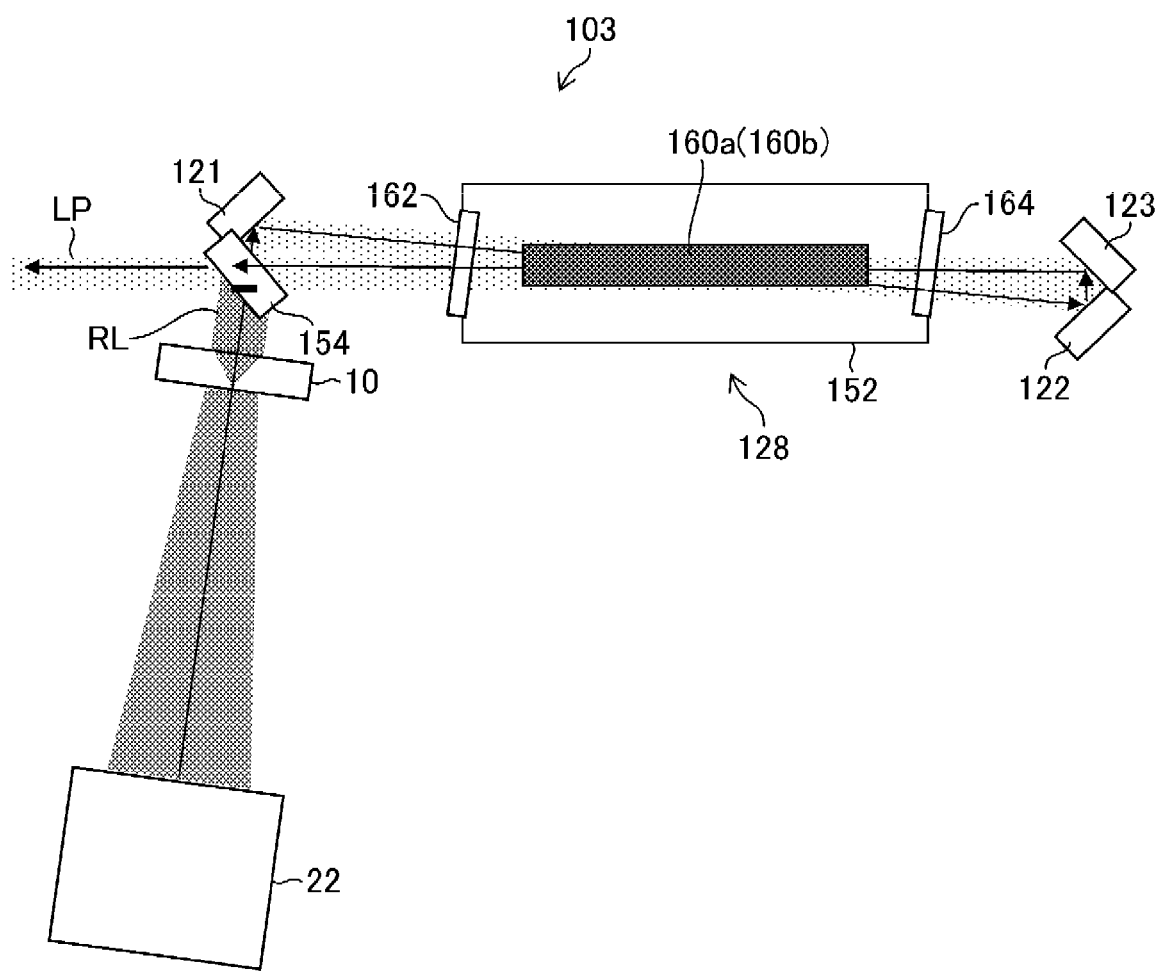
FIG. 10 is a plan view schematically illustrating an exemplary configuration of a laser apparatus according to Embodiment 3.

FIG. 10 is a plan view schematically illustrating an exemplary configuration of a laser apparatus 103 according to Embodiment 3. Description will be made on the difference of the configuration illustrated in FIG. 10 from the configuration illustrated in FIG. 6. In the laser apparatus 103 illustrated in FIG. 10, part of the power oscillator 28 in FIG. 6 is replaced with the configuration of a ring-resonator amplifier 128.

Specifically, the laser apparatus 103 illustrated in FIG. 10 includes the ring-resonator amplifier 128. The amplifier 128 includes a chamber 152, high reflectance mirrors 121, 122, and 123, and an output coupling mirror 154. The chamber 152 includes a pair of discharge electrodes 160a and 160b and two windows 162 and 164. The discharge electrodes 160a and 160b are disposed opposite each other at an interval in a direction perpendicular to the sheet of FIG. 10. The laser gas is introduced into the chamber 152. The output coupling mirror 154 is a partially reflective mirror. The output coupling mirror 154 and the high reflectance mirrors 121, 122, and 123 constitute a ring-type optical resonator (ring resonator). The chamber 152 is disposed on the optical path of the ring resonator.

The random phase plate 10 is disposed on the optical path between the master oscillator 22 and the output coupling mirror 154. The random phase plate 10 is preferably disposed as close as possible to the output coupling mirror 154. As described with reference to FIG. 7, the random phase plate 10 is preferably disposed at a position of 20 cm or shorter from the output coupling mirror 154.

5.2 Operation

The seed beam emitted from the master oscillator 22 is incident on the output coupling mirror 154 of the amplifier 128 through the random phase plate 10. A surface of the output coupling mirror 154 on a side on which the seed beam is incident is a beam imaging position of the non-illustrated output coupling mirror (refer to reference sign 34 in FIG. 6) of the master oscillator 22. Part of the seed beam incident on the output coupling mirror 154 passes through the output coupling mirror 154 and is reflected by the high reflectance mirror 121. The seed beam reflected by the high reflectance mirror 121 passes through the window 162 and proceeds to a discharge space between the discharge electrodes 160a and 160b.

The seed beam is amplified when control to cause discharge between the electrodes is performed while the seed beam exists in the discharge space. The amplified laser beam is output from the chamber 152 through the window 164. The laser beam output from the window 164 is highly reflected by the high reflectance mirrors 122 and 123, proceeds to the discharge space in the chamber 152 through the window 164 again, and is amplified.

The laser beam thus amplified is output from the chamber 152 through the window 162. The amplified laser beam output from the window 162 is incident on the output coupling mirror 154. Part of the amplified laser beam incident on the output coupling mirror 154 passes through the output coupling mirror 154 and is emitted as the output laser beam LP from the amplifier 128 toward a non-illustrated exposure apparatus.

The other part of the amplified laser beam incident on the output coupling mirror 154 is reflected by the output coupling mirror 154 and returned as feedback light into the ring resonator again. Part of the laser beam amplified by the ring resonator is output as the return light RL from the output coupling mirror 154 toward the master oscillator 22.

Similarly to Embodiment 1, the random phase plate 10 functions to expand the beam expansion angles of the return light RL.

5.3 Effect

Effects same as those of the laser apparatus 100 according to Embodiment 1 are obtained with the laser apparatus 103 according to Embodiment 3.

6. Embodiment 4

6.1 Configuration

Figure 11:
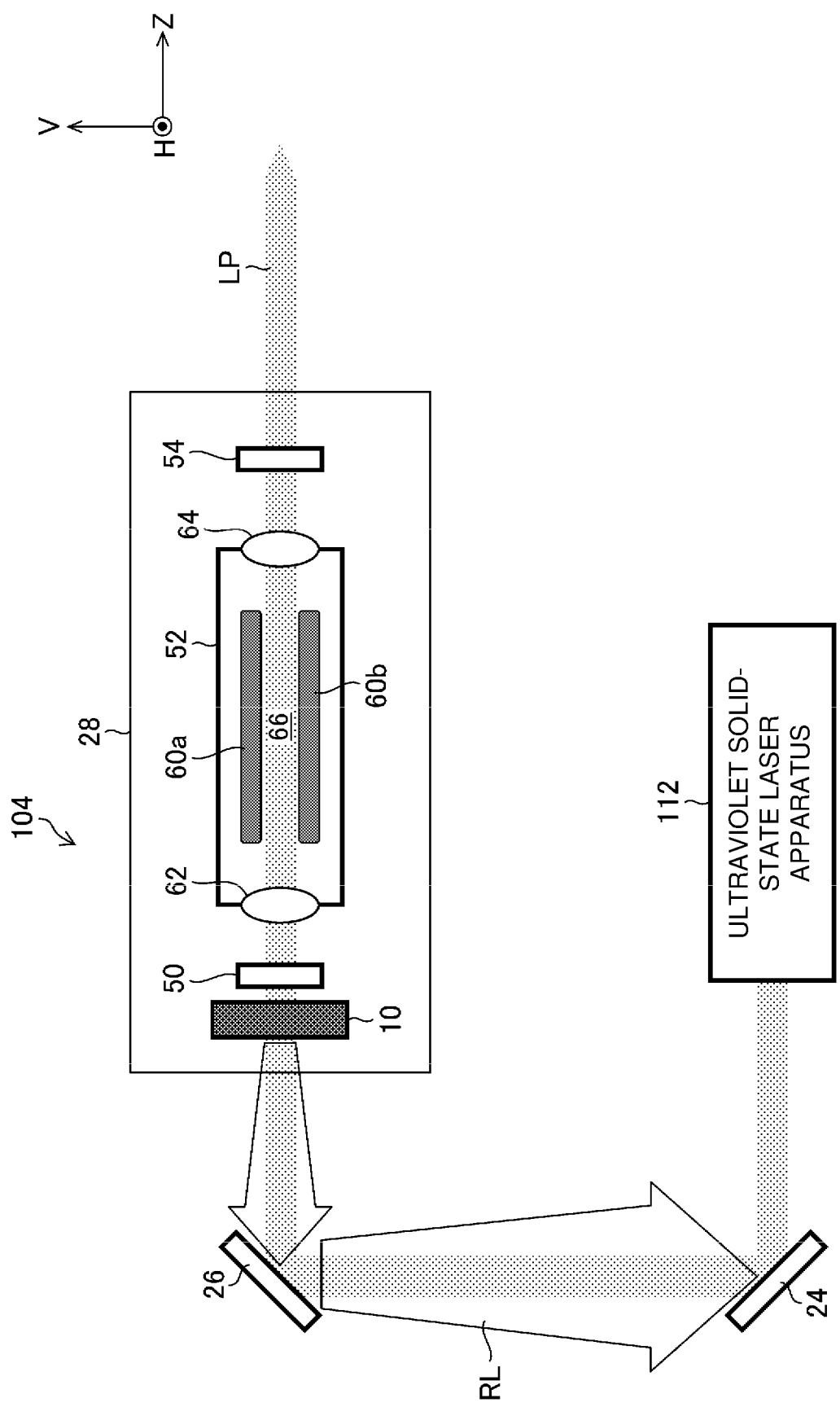
FIG. 11 is a plan view schematically illustrating an exemplary configuration of a laser apparatus according to Embodiment 4.

FIG. 11 is a plan view schematically illustrating an exemplary configuration of a laser apparatus 104 according to Embodiment 4. Description will be made on the difference of the configuration illustrated in FIG. 11 from the configuration illustrated in FIG. 6. In the laser apparatus 104 illustrated in FIG. 11, part of the master oscillator 22 in FIG. 6 is replaced with an ultraviolet solid-state laser apparatus 112. The ultraviolet solid-state laser apparatus 112 is an example of a "master oscillator" in the present disclosure. The other configuration may be same as the configuration illustrated in FIG. 6.

Although a detailed configuration of the ultraviolet solid-state laser apparatus 112 is not illustrated, the ultraviolet solid-state laser apparatus 112 may be, for example, a laser apparatus in which a titanium sapphire laser having a narrowed spectral width and a non-linear crystal are combined. Alternatively, the ultraviolet solid-state laser apparatus 112 may be, for example, a laser apparatus in which a semiconductor laser and a non-linear crystal are combined. The non-linear crystal is used at a wavelength conversion unit.

Contents described with reference to FIG. 7 are also applied to the configuration of the laser apparatus 104 according to Embodiment 4 when the output coupling mirror 34 described with reference to FIG. 7 is replaced with the non-linear crystal that generates an emission wavelength in the ultraviolet solid-state laser apparatus 112.

6.2 Operation

The seed beam emitted from the ultraviolet solid-state laser apparatus 112 passes through the random phase plate 10 and enters the optical resonator of the power oscillator 28. Part of the laser beam amplified by the optical resonator of the power oscillator 28 is output as the return light RL from the rear mirror 50. The random phase plate 10 functions to expand the beam expansion angles of the return light RL output from the rear mirror 50 toward the ultraviolet solid-state laser apparatus 112.

When the return light RL is returned to the non-linear crystal of the wavelength conversion unit, the light would cause a thermal load or the like and potentially destabilize oscillation performance. However, since the return light RL is diffused by the random phase plate 10, the amount of light returned to the non-linear crystal of the wavelength conversion unit is suppressed.

6.3 Effect

In the laser apparatus 104 according to Embodiment 4, decrease of the efficiency of light injection into the optical resonator of the power oscillator 28 is suppressed, and the amount of light returned to the ultraviolet solid-state laser apparatus 112 decreases since the return light RL passes and diffuses through the random phase plate 10. Accordingly, stability degradation of energy and wavelength due to the return light RL can be suppressed. Moreover, according to Embodiment 4, degradation of an optical element such as a non-linear crystal can be suppressed.

6.4 Modification

The optical element 70 as a rear mirror with a random phase structure, which is described in Embodiment 2, may be employed in place of the random phase plate 10 and the rear mirror 50 in the laser apparatus 104 illustrated in FIG. 11.

7. Electronic Device Manufacturing Method

Figure 12:
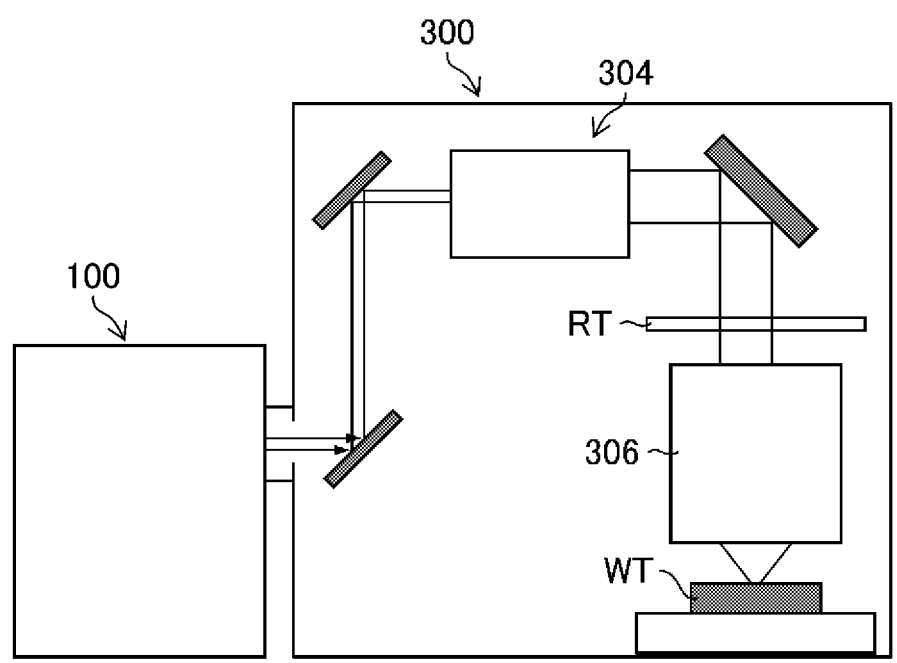
FIG. 12 schematically illustrates an exemplary configuration of an exposure apparatus.

FIG. 12 schematically illustrates an exemplary configuration of an exposure apparatus 300. The exposure apparatus 300 includes an illumination optical system 304 and a projection optical system 306. The illumination optical system 304 illuminates, with a laser beam arriving from the laser apparatus 100, a reticle pattern of a non-illustrated reticle disposed on a reticle stage RT. The laser beam having passed through the reticle is subjected to reduced projection through the projection optical system 306 and imaged on a non-illustrated workpiece disposed on a workpiece table WT. The workpiece is a photosensitive substrate such as a semiconductor wafer on which photoresist is applied.

The exposure apparatus 300 translates the reticle stage RT and the workpiece table WT in synchronization such that the workpiece is exposed to the laser beam on which the reticle pattern is reflected. A semiconductor device can be manufactured through a plurality of processes after the reticle pattern is transferred onto the semiconductor wafer through the exposure process as described above. The semiconductor device is an example of an "electronic device" in the present disclosure. The laser apparatuses 102, 103, and 104 described above in Embodiments 2 to 4 may be each used in place of the laser apparatus 100.

8. Other

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. A laser apparatus comprising:
   a master oscillator configured to emit a laser beam;
   an amplifier including an optical resonator and configured to amplify the laser beam emitted by the master oscillator in the optical resonator; and
   a phase shift structure disposed on an optical path between the master oscillator and the amplifier at a position closer to the amplifier than a middle point of the optical path,
   the phase shift structure including a plurality of cells having different phase shift amounts for the laser beam,
   the cells having a disposition interval of 80 μm to 275 μm inclusive, wherein
   the amplifier includes a pair of discharge electrodes disposed opposite each other across a discharge space through which the laser beam passes, and
   when a Z direction is defined to be a traveling direction of the laser beam emitted from the amplifier, a V direction is defined to be a discharge direction of the discharge electrodes, an H direction is defined to be a direction orthogonal to the V direction and the Z direction, a first direction is defined to be an in-surface direction of the phase shift structure corresponding to the V direction in a beam section of the laser beam emitted from the amplifier, and a second direction is defined to be an in-surface direction of the phase shift structure corresponding to the H direction in the beam section,
   a length of each of the cells in the first direction is different from a length of the cell in the second direction.

2. The laser apparatus according to claim 1, further comprising a plurality of mirrors disposed on the optical path between the master oscillator and the optical resonator, wherein the phase shift structure is disposed between the optical resonator and a mirror closest to the optical resonator among the mirrors.

3. The laser apparatus according to claim 1, wherein
   the optical resonator includes a partially reflective mirror that outputs return light toward the master oscillator, and
   a distance between the partially reflective mirror and the phase shift structure is equal to or shorter than 20 cm.

4. The laser apparatus according to claim 3, wherein the optical resonator includes an output coupling mirror and a rear mirror as the partially reflective mirror.

5. The laser apparatus according to claim 1, wherein
   the cells include first cells each having a phase shift amount of zero and second cells each having a phase shift amount of x, and
   the first cells and the second cells of the phase shift structure are disposed spatially at random.

6. The laser apparatus according to claim 1, comprising a random phase plate as the phase shift structure.

7. The laser apparatus according to claim 1, comprising:
   a rear mirror having a first surface and a second surface on a side opposite to the first surface, the first surface being coated with a partial reflection film, the second surface being coated with a film of the phase shift structure; and
   an output coupling mirror, wherein
   the optical resonator is constituted by the partial reflection film and the output coupling mirror.

8. The laser apparatus according to claim 1, wherein the optical resonator is a ring resonator.

9. The laser apparatus according to claim 1, wherein the master oscillator is a discharge-pumped excimer laser apparatus including a line narrowing module.

10. The laser apparatus according to claim 1, wherein the master oscillator is an ultraviolet solid-state laser apparatus.

11. The laser apparatus according to claim 1, wherein each of the cells has a polygonal shape.

12. The laser apparatus according to claim 1, wherein
    when $\theta_A$ represents a beam expansion angle of the laser beam emitted from the amplifier and $\theta_{RPP}$ represents a beam expansion angle of the laser beam after having passed through the phase shift structure,
    the disposition interval of the cells of the phase shift structure is selected such that a difference between $\theta_{RPP}$ and $\theta_A$ is within a predetermined allowable range.

13. The laser apparatus according to claim 1, wherein
    $\theta_{AV}$ represents a beam expansion angle of the laser beam emitted from the amplifier in the V direction, $\theta_{AH}$ represents a beam expansion angle of the laser beam in the H direction, $\theta_{RPP\_V}$ represents a beam expansion angle of the laser beam having passed through the phase shift structure in the first direction, and $\theta_{RPP\_H}$ represents a beam expansion angle of the laser beam having passed through the phase shift structure in the second direction,
    the disposition interval of the cells of the phase shift structure in each of the first direction and the second direction is selected such that a difference between $\theta_{RPP\_V}$ and $\theta_{AV}$ is within a predetermined allowable range and a difference between $\theta_{RPP\_H}$ and $\theta_{AH}$ is within a predetermined allowable range.

14. The laser apparatus according to claim 13, wherein
    when $\lambda$ represents a wavelength of the laser beam, $\theta_{AV1}$ represents an upper limit of the beam expansion angle of the laser beam emitted from the amplifier in the V direction, and $\theta_{AH1}$ represents an upper limit of the beam expansion angle of the laser beam emitted from the amplifier in the H direction,
    the disposition interval of the cells in the first direction is equal to or larger than $\lambda/(1.5 \cdot \theta_{AV1})$, and
    the disposition interval of the cells in the second direction is equal to or larger than $\lambda/(1.5 \cdot \theta_{AH1})$.

15. The laser apparatus according to claim 13, wherein
    when $\lambda$ represents a wavelength of the laser beam, $\theta_{AV2}$ represents a lower limit of the beam expansion angle of the laser beam emitted from the amplifier in the V direction, and $\theta_{AH2}$ represents a lower limit of the beam expansion angle of the laser beam emitted from the amplifier in the H direction,
    the disposition interval of the cells in the first direction is equal to or smaller than $\lambda/\theta_{AV2}$, and
    the disposition interval of the cells in the second direction is equal to or smaller than $\lambda/\theta_{AH2}$.

16. A laser apparatus comprising:
    a master oscillator configured to emit a laser beam;
    an amplifier including an optical resonator and configured to amplify the laser beam emitted by the master oscillator in the optical resonator; and a phase shift structure disposed on an optical path between the master oscillator and the amplifier at a position closer to the amplifier than a middle point of the optical path, the phase shift structure including a plurality of cells having different phase shift amounts for the laser beam, the cells having a disposition interval of $\lambda/(1.5 \cdot \theta_{Amax})$ to $\lambda/\theta_{Amin}$ inclusive when $\lambda$ represents a wavelength of the laser beam, $\theta_{Amax}$ represents an upper limit of a beam expansion angle of the laser beam emitted from the amplifier, and $\theta_{Amin}$ represents a lower limit of the beam expansion angle.

17. The laser apparatus according to claim 16, wherein the disposition interval of the cells is $\lambda/\theta_{Amax}$ to $\lambda/\theta_{Amin}$ inclusive.

18. An electronic device manufacturing method comprising:

generating a laser beam amplified by an amplifier by using a laser apparatus, the laser apparatus including a master oscillator configured to emit a laser beam, the amplifier including an optical resonator and configured to amplify the laser beam emitted by the master oscillator in the optical resonator, and a phase shift structure disposed on an optical path between the master oscillator and the amplifier at a position closer to the amplifier than a middle point of the optical path, the phase shift structure including a plurality of cells having different phase shift amounts for the laser beam, the cells having a disposition interval of 80 μm to 275 μm inclusive;

emitting the amplified laser beam to an exposure apparatus; and exposing a photosensitive substrate to the amplified laser beam in the exposure apparatus to manufacture an electronic device, wherein the amplifier includes a pair of discharge electrodes disposed opposite each other across a discharge space through which the laser beam passes, and when a Z direction is defined to be a traveling direction of the laser beam emitted from the amplifier, a V direction is defined to be a discharge direction of the discharge electrodes, an H direction is defined to be a direction orthogonal to the V direction and the Z direction, a first direction is defined to be an in-surface direction of the phase shift structure corresponding to the V direction in a beam section of the laser beam emitted from the amplifier, and a second direction is defined to be an in-surface direction of the phase shift structure corresponding to the H direction in the beam section, a length of each of the cells in the first direction is different from a length of the cell in the second direction.

\* \* \* \* \*